United States Patent
Karnad et al.

(10) Patent No.: US 7,592,860 B2
(45) Date of Patent: Sep. 22, 2009

(54) MINIMIZING THE NUMBER OF EXTERNAL TERMINALS REQUIRED WHEN COMPENSATION IS TO BE PROVIDED FOR SIGNAL DROP IN BOND WIRE OF A PACKAGE IN WHICH AN INTEGRATED CIRCUIT IS PROVIDED

(75) Inventors: Ravindra Karnad, Bangalore (IN); Venkataraman Srinivasan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 89 days.

(21) Appl. No.: 11/855,167

(22) Filed: Sep. 14, 2007

(65) Prior Publication Data

US 2009/0072892 A1 Mar. 19, 2009

(51) Int. Cl.
*H01L 49/02* (2006.01)
*G05F 1/10* (2006.01)

(52) U.S. Cl. ....................... 327/540; 327/565
(58) Field of Classification Search ................. 327/565, 327/530, 531, 535, 538, 540; 323/273
See application file for complete search history.

(56) References Cited

U.S. PATENT DOCUMENTS 6,184,585 B1 * 2/2001 Martinez et al. ............. 257/777
6,469,895 B1 * 10/2002 Smith et al. .................. 361/704
7,352,202 B2 * 4/2008 Billingsley et al. .......... 324/769

OTHER PUBLICATIONS

R.K.Dokania and G.A.Rincon-Mora, "Cancellation of load regulation in low drop-out regulators", Dated Oct. 24, 2002, pp. 1300-1302,vol. 38 No. 22, IEE.

* cited by examiner

*Primary Examiner*—Dinh T. Le
(74) *Attorney, Agent, or Firm*—John J. Patti; Wade J. Brady, III; Frederick J. Telecky, Jr.

(57) ABSTRACT

Compensation is provided for signal drop in bond wires of an integrated circuit (IC) while minimizing the number of external terminals in the IC package. A functional circuit provides an output signal (e.g., voltage) on a pad of the IC, which is connected to an external terminal on the package via a bond wire. A second circuit contained in the IC determines the signal drop in the bond wire by examining a parameter (e.g., current) proportional to a strength of the output signal at or before the pad in a transmission path of the signal. Thus, additional external terminals to sense the signal strength at a point external to the IC to provide compensation for the drop may not be required.

13 Claims, 3 Drawing Sheets

MINIMIZING THE NUMBER OF EXTERNAL TERMINALS REQUIRED WHEN COMPENSATION IS TO BE PROVIDED FOR SIGNAL DROP IN BOND WIRE OF A PACKAGE IN WHICH AN INTEGRATED CIRCUIT IS PROVIDED

BACKGROUND

1. Field of the Invention

The present invention relates generally to Integrated Circuits (IC), and more specifically to techniques for minimizing the number of external terminals required when compensation is to be provided for signal drop in a bond wire of a package in which an IC is provided.

2. Related Art

An integrated circuit (IC, sometimes also referred to variously as microcircuit, microchip, silicon chip, chip, etc.) generally is a miniaturized circuit, often containing semiconductor devices (as well as passive components such as resistors etc) that have been manufactured on a substrate, usually of a semiconductor or ceramic material.

An IC may be constructed/fabricated as a monolithic IC or hybrid IC. In a monolithic IC, the entire circuit is built into a single piece of semiconductor (chip), whereas a hybrid IC may contain multiple monolithic integrated circuits, and/or discrete semiconductor device circuits (typically fabricated on a ceramic substrate) interconnected in a desired manner.

ICs may be packaged in a housing (IC package, chip package), which is generally suitable for plugging into or soldering onto a printed circuit board. Dual-in-line package (DIP), Small-outline-IC (SOIC), plastic leaded chip carrier (PLCC), flat-pack etc., are some examples of the various packages, as is well-known in the relevant arts. Each package contains external terminals (such as a pin or ball), which may operate as input, output and/or power pins.

An IC may contain one or more pads on which corresponding signals of interest such as input signals, output signals, power supply voltages, etc., are provided/received to/from external components. A pad generally refers to a contact on the substrate to provide/receive such signals, and is often implemented as a metal.

Generally, each pad of the IC is connected by a bond wire (often made of gold) to a corresponding external terminal on the IC package. A bond wire may be associated with an impedance and often causes a reduction in signal strength (signal drop). For example, the voltage drop (IR drop) caused by a bond wire, may cause an output voltage generated in the IC (e.g., at a pad of the IC) to be below a desired level (strength) at the external terminals.

Therefore, it is desirable to compensate for such signal drops due to bond wires. It is further generally desirable that the compensation be provided while reducing (or using as few pins as possible) the pin-count (i.e., number of external terminals) requirements.

Several aspects of the present invention enable minimizing the number of external terminals required when compensation is to be provided for signal drop in bond wire of a package in which an integrated circuit is provided.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

An Integrated Circuit (IC) implemented according to an aspect of the present invention contains a functional circuit to generate an output signal. The functional circuit provides the output signal on a pad of the IC, which is connected to an external terminal on the IC package via a bond wire. The IC contains a second circuit to determine the difference between the strengths of the output signal at the pad and at the external terminal by examining a parameter proportional to a strength of the signal at or before the pad in a transmission path of the signal in the IC. The strength of the signal is adjusted by the difference (for example, by generating a corresponding correction voltage) to ensure that the signal has a desired strength at the external terminal, thereby compensating for signal drop in the bond wire.

Since the difference is determined by examining a parameter at or before the pad, additional external terminals may not be required to provide compensation.

According to another aspect of the present invention, an IC contains a scaling block to amplify the difference of the strengths noted above. As a result, components such as resistors used in the circuit to generate a correction voltage may be implemented as small value resistors occupying a small area on the IC.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Integrated Circuit Package

Figure 1:
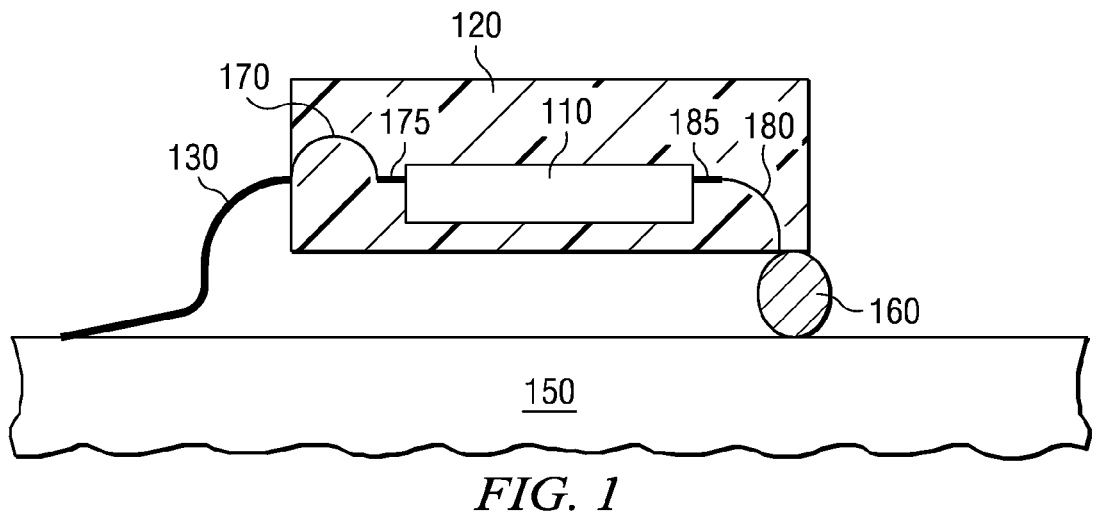
FIG. 1 is a diagram illustrating an Integrated Circuit (IC) housed in an IC package in one embodiment.

FIG. 1 is a diagram illustrating an IC housed in a package. IC 110 is shown housed in package 120. Pad 175 is shown connected through bond wire 170 to an external terminal 130, which is a pin in this example. Pad 185 is shown connected to an external terminal via bond wire 180, with the external terminal shown implemented as ball 160. Typically, an IC is packaged with either balls or pins, though the diagram is shown containing both merely for illustration.

Figure 2:
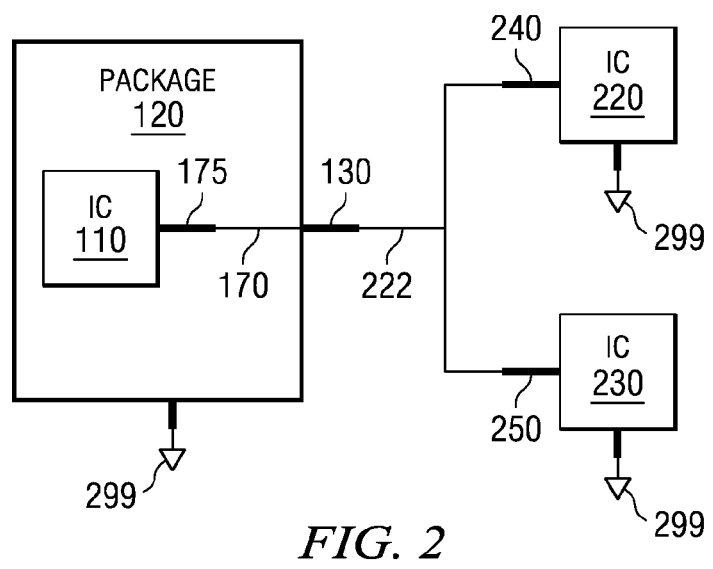
FIG. 2 is a block diagram illustrating example interconnections between ICs on a printed circuit board.

IC 110 in packaged form (i.e., package 120) is typically mounted or soldered on PCB 150 to enable interconnections with other ICs/devices in PCB 150 to achieve a desired operation, as illustrated in FIG. 2.

FIG. 2 is a block diagram illustrating the interconnections between IC 110 (housed in package 120) and ICs 220 and 230 (which may also be in packaged form). IC 110 is shown with a logical view (removing some of the components not needed) with only those components needed for understanding IR drop being included.

The voltage output on pad 175 is provided to external terminal 130 via bond wire 170. External pin 130 is shown connected to pins 240 and 250 of ICs 220 and 230 respectively via PCB trace 222. Pins 240 and 250 may correspond to power supply pins of ICs 220 and 230 respectively.

During operation, corresponding internal circuitry connected to pins 240 and 250 (of ICs 220 and 230 respectively) draws current from the voltage output on pad 175. Due to the impedance (e.g., resistance) of bond wire 170, a voltage (IR) drop in bond wire 170 causes the voltage (strength) on external terminal 130 (and hence pins 240 and 250) to be less than the voltage provided on pad 175 (by IC 110), thereby resulting in poor load regulation.

For example, assuming that it is required to supply a voltage of 1.75 V (volts) on pins 240 and 250, IC 110 may be designed to generate 1.75V (available/provided on pad 175). However, due to the voltage drop in bond wire 170 noted above, the voltage at external terminal 130 (and hence pins 240 and 250) may be less than 1.75V. Consequently, techniques to compensate for the voltage drop are typically employed, as noted below with respect to a prior technique.

3. Prior Technique for Compensation

Figure 3:
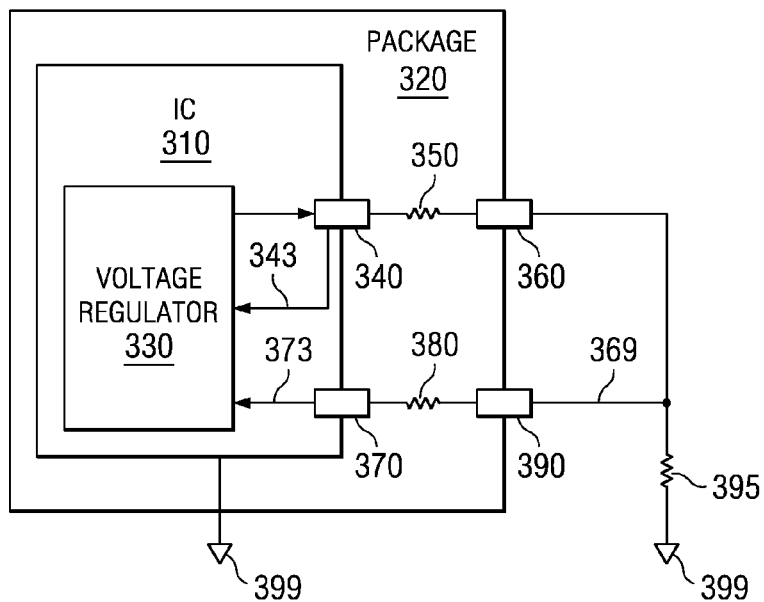
FIG. 3 is a diagram illustrating the manner in which compensation for signal drop in the bond wire of an IC package is provided according to a prior approach.

FIG. 3 is a diagram illustrating the manner in which compensation for signal drop in the bond wire of an IC package is provided according to a prior approach.

IC 310 packaged in IC package 320 is shown containing voltage regulator 330. Voltage regulator 330 provides a desired voltage on pad 340, which is available to external devices via external terminal 360 and bond wire 350.

Resistor 395 represents a load presented by external components (for example, ICs 220 and 230 of FIG. 2) to the voltage provided by voltage regulator 330. As noted above, the voltage drop due to bond wire 350 may cause the voltage at external terminal 360 (and hence across load resistor 395) to be less than a desired value (such as the value provided by voltage regulator 330 at pad 340).

In the prior technique of FIG. 3, IC package 320 contains an input terminal 390 (connected to pad 370 via bond wire 380) for sensing (measuring) the voltage at a point external to IC 310 (and also IC package 320). As shown in FIG. 3, voltage regulator 330 receives the voltages at pad 340 (via path 343) and load resistor 395 (via path formed by 369, 390, 380, 370 and 373). Voltage regulator 330 may then adjust (e.g., by increasing) the output voltage so that the voltage at terminal 360 and hence across load resistor 395 is at a desired level.

In general, one input terminal each for the positive signal path and a return (e.g., ground) signal path may be required to provide compensation according to the technique of FIG. 3, generally known in the relevant arts as 4-wire Kelvin sensing.

The prior technique noted above, however, requires at least one additional external pin (e.g. 390 in FIG. 3) and pad (370) for each output for which compensation is to be provided, thereby increasing the pin count of package 320. This is often undesirable.

Several aspects of the present invention provide compensation for signal drop due to bond wire while minimizing the number of external terminals of an IC package, as described next with respect to an example embodiment.

4. Compensation with Reduced Number of Pins

Figure 4:
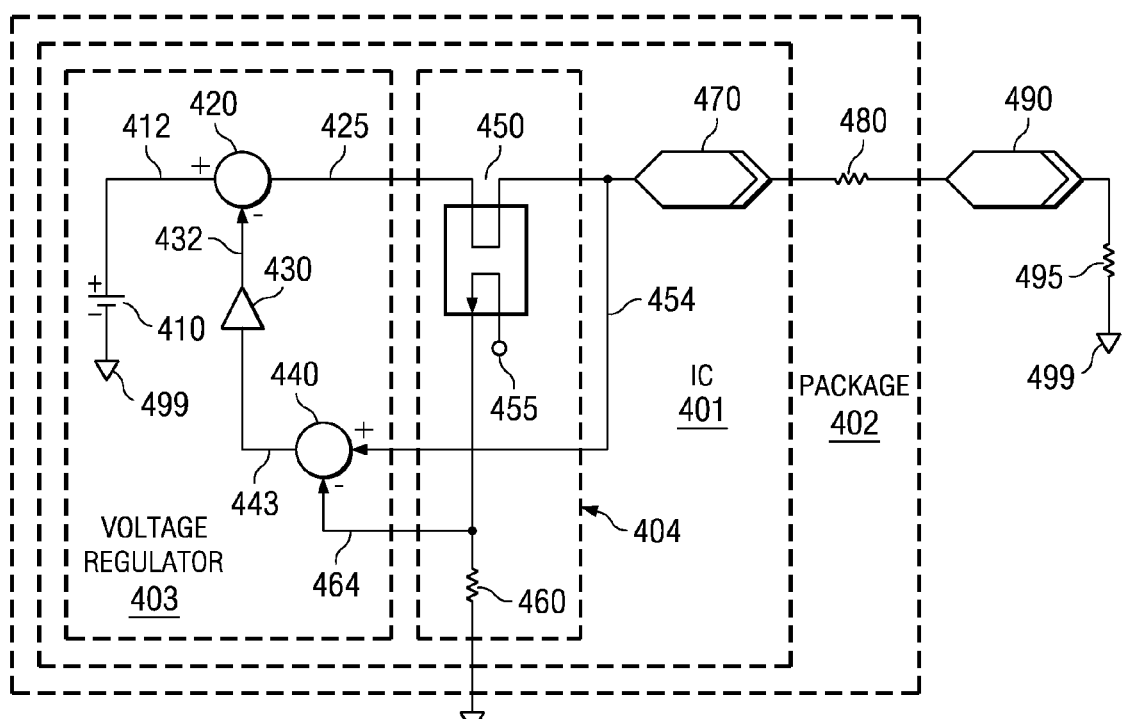
FIG. 4 is a diagram of an IC in an embodiment of the present invention providing compensation for signal drop in bond wires.

FIG. 4 is a diagram of an IC in an embodiment of the present invention. IC 401 is shown packaged in package 402, and contains a low drop-out (LDO) voltage regulator 403 providing a voltage output on pad 470, in turn connected to an external terminal 490 via bond wire 480. Resistor 495 represents a load presented to the output voltage on external terminal 490.

In FIG. 4, it is assumed that all voltages are provided with respect to ground terminal 499. It is also assumed (but not shown) that the respective components shown in the Figure are connected to appropriate power supply terminals (which may, for example, be connected to an external power supply via an external terminal, not shown). Further the components of FIG. 4 are provided merely by way of illustration, and various features of the present invention can be implemented in other environments and other components. The various sub-components/blocks of FIG. 4 are described in detail below.

LDO Voltage regulator 403 represents an example functional circuit which generates an output signal provided on pad 470, and is shown containing voltage generator 410, summing blocks 420 and 440 and gain block 430. The details of an example implementation of voltage regulator 403 as a low-drop out (LDO) regulator is illustrated and described in product description of part number REG102-25 (Single Output LDO, 250 mA, Fixed (2.5V), Low Noise, Fast Transient Response), designed by Texas Instruments. An LDO regulator generally refers to a linear voltage regulator that provides a regulated voltage output when the input voltage (e.g., on path 412) is only very slightly larger than the voltage (pad 470).

Voltage generator 410 represents a stable power source providing a voltage on path 412, and may correspond, for example, to a battery, or a voltage reference generating a voltage from an external source (not shown).

Summing block 440 receives as input a voltage signal each on paths 454 (connected to path 425 or pad 470) and 464, and provides a difference of the voltages on path 443. Gain block 430 amplifies the voltage difference on path 443 and provides an amplified voltage on path 432. Summing block 440 and gain block 430 may together be referred to as an error amplifier. In an embodiment the error amplifier is implemented as an Operational Amplifier (OPAMP).

Summing block 420 provides a difference of voltages on paths 412 and 432 and provides a voltage on path 425. Voltage signal on path 425 is also available on pad 470 and external terminal 490, although at different strengths. In an embodiment, summing block 420 is implemented as a single-stage Operational Amplifier (OPAMP) having a single-pole roll-off (low-pass filter characteristics).

During operation, load resistor 495 draws a current, resulting in a voltage drop across bond wire 480, which in turn causes the voltage strength on external terminal 490 to be less than that at pad 470. Path 425, pad 470, bond wire 480, external terminal 490, load resistor 495 and return path 499 (ground) may be referred to as a transmission path of the output voltage generated/provided by voltage regulator 403.

According to an aspect of the present invention, IC 401 contains circuit 404 (also referred to as a second circuit in this document) formed by sense element 450 and "compensation"

resistor 460. Sense element 450 senses the output current 'IL' (on the transmission path noted above) and provides a fraction "α" of the output current 'IL" to flow across "compensation" metal resistor 460 (RCOMP). Node 455 may be connected to a voltage generated internally in IC 401. Sense element 450 may be implemented using techniques, well known in the relevant arts.

The fraction a is selected (usually much less than 1) such that voltage drop across metal resistor 460 (RCOMP) is substantially the same as the voltage drop across bond wire 480. The value of resistor 460 may be chosen based on the value of the impedance (resistance) of bond wire 480, which is usually known at the time of packaging IC 401.

The "compensation" (or correction) voltage generated on path 464 is given by the following equation:

$$VCOMP = (\alpha * IL * RCOMP) \quad \text{Equation 1}$$

$$= (RBW * IL) \quad \text{Equation 2}$$

wherein,

VCOMP is the compensation voltage generated on path 464,

RCOMP is the value of resistor 460, and

RBW is the value of resistance of bond wire 480.

From equations 1 and 2:

$$RCOMP = RBW/\alpha \quad \text{Equation 3}$$

RBW may be known a priori (before fabrication of IC 401) and thus RCOMP may be selected accordingly. Designating the voltage on paths 412 as Vref, and on pad 470 (or path 425) as VOUT, the feedback loop formed by path 454-440-43-432-420 will ensure that in the stable condition Vref is given by the following equation:

$$Vref = K(VOUT - VCOMP) \quad \text{Equation 4}$$

Wherein K represents the gain provided by gain block 430. From equation 4:

$$VOUT = [Vref + (K * VCOMP)]/K$$

$$= (Vref/K) + VCOMP \quad \text{Equation 5}$$

Assuming VCOMP substantially equals the voltage drop (RBW*IL) across bond wire 480, equation 5 may be written as:

$$VOUT = (Vref/K) + (RBW * IL) \quad \text{Equation 6}$$

It may be noted from equation 6 that VOUT has been boosted up (compensated) to the extent of the bond-wire drop represented by (RBW*IL). That is, the output voltage on pad 470 and consequently on external terminal 490 has been compensated for the voltage drop in the bond-wire 490. The compensation is provided across variations in load current IL.

It may be observed also that the circuit of FIG. 4 determines the magnitude of voltage drop in bond wire 480 by sensing (examining) the load current at or before pad 470, thereby not requiring an additional input terminal (such as 390 in FIG. 3). As a result, compensation is provided without requiring additional pins, thereby minimizing pin count of package 402.

It is usually desirable that compensation be effective across a wide range of temperatures (example, over a range 125 degrees centigrade), thereby requiring that both RCOMP (resistor 460) and RBW (bond wire 480) have the same (or very nearly the same) temperature coefficient of resistivity. RBW usually being a metal (such as gold having a temperature coefficient of resistivity of 4 parts per million per degree centigrade), RCOMP may be implemented as a metal resistor (Copper or Aluminium having temperature coefficients of resistivity of 4.3 and 4.2 parts per million per degree centigrade respectively) on-chip so that RCOMP substantially tracks the changes of bond-wire resistance RBW over wide temperature ranges.

As noted above, the value of α is generally selected to have a value much less than 1 to minimize power dissipation in RCOMP. However, a value of α much less than 1 requires that RCOMP have a value much larger than RBW, as may be observed on inspection of Equation 3. Such a large value for RCOMP generally requires resistor 460 to have a large area, thus occupying a large die area on IC 401. This may not be desirable for reasons such as size, cost of fabricating IC 401 etc.

An alternative embodiment of the present invention overcomes the drawback noted above, and is described next.

5. Compensation Across a Wide Temperature Range with Smaller Chip Area

Figure 5:
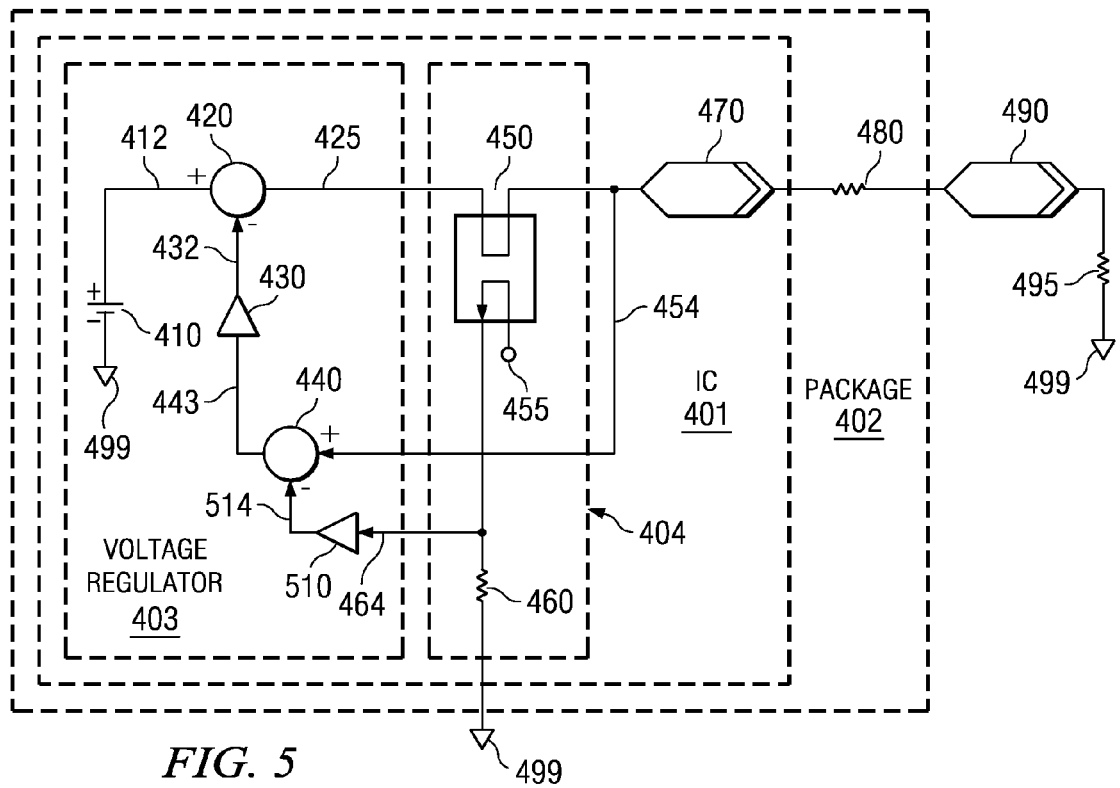
FIG. 5 is a diagram of an IC in an alternative embodiment of the present invention providing compensation for signal drop in bond wires, while minimizing the area on the IC.

FIG. 5 is a diagram of IC 401 in an alternative embodiment. All components/blocks in FIG. 5 are similar to corresponding components/blocks in FIG. 4. In addition, in the alternative embodiment of FIG. 5, IC 401 contains a scaling block 510 to amplify the correction voltage generated on path 464 by a suitable factor K1, and provide the scaled correction voltage to summing block 440 via path 514.

The value of correction voltage VCOMP in the circuit of FIG. 5 may be expressed as:

$$VCOMP = (K1 * \alpha * IL * RCOMP) \quad \text{Equation 7}$$

For the compensation to be effective, the value of VCOMP as expressed in equation 7 may need to also equal (K1*RBW*IL), i.e., $$VCOMP = (RBW * IL) \quad \text{Equation 8}$$

From equations 7 and 8 the expression of RCOMP may be obtained as:

$$RCOMP = RBW/(K1 * \alpha) \quad \text{Equation 9}$$

Thus, by selecting K1 to be suitably large, the value of RCOMP (and hence area on IC 401) may be made small. As an example, assuming α is chosen to be 0.01 so that power dissipation in RCOMP is minimized, value of RCOMP is chosen sufficiently small so that area on the die (as well as power dissipation) is minimized. The value of K1 may then be chosen to be:

$$K1 = 100 * RBW/RCOMP.$$

Figure 6:
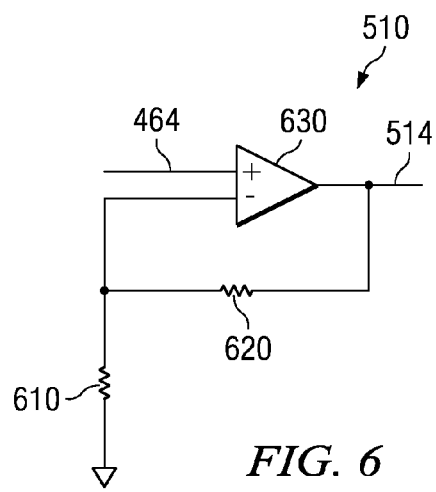
FIG. 6 is a diagram of a scaling block used in an embodiment of the present invention.

In an embodiment scaling block 510 is implemented as an OPAMP connected in a non-inverting configuration, as shown in FIG. 6. In FIG. 6, OPAMP 630 is shown connected in a non-inverting configuration. The gain of OPAMP 630 is given by (1+Rf/R), wherein Rf is the value of resistor 620, and R is the value of resistor 610. Resistors 610 and 620 are implemented using a same material.

Therefore, resistors 610 and 620 have the same temperature coefficient of resistivity, thereby resulting in the value of gain K1 being substantially constant over a wide temperature range. Further, resistors 610 and 620 may be placed in IC 401 such that variations in their resistance values are minimized over process variations also.

IC 401 implemented as described above may contain several functional circuit blocks (in addition to functional circuit 403). IC 401 may, for example be a system-on-a-chip (SOC) incorporating multiple operational/functional blocks to provide features of a large system (for example, telecommunications system) and may contain microprocessor(s), digital signal processor (DSP), RAM and ROM, graphics processors etc. Functional block 403 (operating in conjunction with sensing block 404 as described above may provide a regulated voltage to several on-chip as well as off-chip (via external terminal 490) components with compensation provided for voltage drop in bond wires as described above.

6. Conclusion

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. An apparatus comprising:
   a package having a terminal and a bond wire, wherein the bond wire is coupled to the terminal, and wherein the bond wire has an impedance; and
   an integrated circuit (IC) that is secured to the package, wherein the IC includes:
   a pad that is coupled to the bond wire;
   a first circuit that provides a transmission signal to the pad, wherein the transmission signal has a first strength at the pad and a second strength at the terminal, wherein the second strength is less than the first strength due to the impedance of the bond wire, and wherein the first circuit includes a feedback loop that receives the first strength of the transmission signal; and
   a second circuit that is coupled between the first circuit and the pad, wherein the second circuit generates a compensation signal that is approximately a difference between the first strength and the second strength of the transmission signal, and wherein the transmission signal is adjusted by the difference to ensure that the signal has a desired strength at the terminal by application of the compensation signal to the feedback loop.

2. The apparatus of claim 1, wherein the first and second strengths further comprise first voltage and a second voltage.

3. The apparatus of claim 2, wherein the second circuit further comprises:
   a current sensing element, that is coupled between the first circuit and the pad and that measures current flowing on the transmission path; and
   a resistor that is coupled to the current sensing element, wherein the current sensing element provides a sensed current to the compensation resistor to generate a corresponding correction voltage substantially equaling the voltage drop in across the bond wire.

4. The apparatus of claim 3, wherein the feedback loop of the first circuit further comprises a summing block, that receives the correction voltage and adds the correction voltage to the output voltage, thereby compensating for the voltage drop.

5. The apparatus of claim 4, wherein the feedback loop of the first circuit comprises a scaling block that is coupled between the resistor and the summing block.

6. A method comprising:
   generating a transmission signal by a first circuit, wherein the transmission signal has a first strength at a pad and a second strength at a terminal, and wherein the second strength is less than the first strength due to the impedance of a the bond wire;
   generating a compensation signal by a second circuit, wherein the compensation signal that is approximately a difference between the first strength and the second strength; and
   adjusting the signal by the difference with a feedback loop within the first circuit to cause the signal to have a desired strength on the terminal by application of the compensation signal to the feedback loop.

7. The method of claim 6, wherein the signal is an output voltage, and wherein the step of generating the compensation signal further comprises:
   sensing a first current;
   generating a second current proportional to the first current; and
   generating a correction voltage substantially equaling the voltage drop in the bond wire.

8. The method of claim 6, wherein the signal is an output voltage, and wherein the step of generating the compensation signal further comprises:
   sensing a first current;
   generating a second current proportional to the first current;
   generating a first voltage proportional to the second current by passing the second current through a compensation resistor; and
   amplifying the first voltage to generate a correction voltage substantially equaling the voltage drop in the bond wire.

9. An apparatus comprising:
   a package having a terminal and a bond wire, wherein the bond wire is coupled to the terminal, and wherein the bond wire has an impedance;
   an IC that is secured to the package, wherein the IC includes:
   a pad that is coupled to the bond wire;
   a voltage regulator that provides a transmission signal to the pad, wherein the transmission signal has a first voltage at the pad and a second voltage at the terminal, wherein the second voltage is less than the first voltage due to the impedance of the bond wire, and wherein the voltage regulator includes a feedback loop that receives the first voltage of the transmission signal; and
   a compensation circuit that is coupled between the voltage regulator and the pad, wherein the compensation circuit generates a compensation signal that is approximately a difference between the first voltage and the second voltage, and wherein the transmission signal is adjusted by the difference to ensure that the signal has a desired strength at the terminal by application of the compensation signal to the feedback loop.

10. The apparatus of claim 9, wherein the compensation circuit further comprises:
    a current sensing element that is coupled between the voltage regulator and the pad; and
    a resistor that is coupled to the current sensing element.

11. The apparatus of claim 9, wherein the feedback loop further comprises a summing element that is coupled to the pad and to the resistor.

12. The apparatus of claim 11, wherein the feedback loop further comprises an amplifier that is coupled between the resistor and the summing element.

13. The apparatus of claim 9, wherein the feedback loop further comprises:
    a first summing element that is coupled to the pad and to the first resistor;
    an amplifier that is coupled to first summing element; and
    a second summing element that is coupled to the amplifier.

* * * * *